(12) United States Patent
Chen et al.

(10) Patent No.: US 10,573,579 B2
(45) Date of Patent: Feb. 25, 2020

(54) SEMICONDUCTOR PACKAGE WITH IMPROVED HEAT DISSIPATION

(71) Applicant: MEDIATEK INC., Hsin-Chu (TW)

(72) Inventors: Tai-Yu Chen, Taipei (TW); Wen-Sung Hsu, Hsinchu County (TW); Sheng-Liang Kuo, Hsinchu County (TW); Chi-Wen Pan, Taipei (TW); Jen-Chuan Chen, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/863,984

(22) Filed: Jan. 8, 2018

(65) Prior Publication Data

US 2018/0261528 A1   Sep. 13, 2018

Related U.S. Application Data

(60) Provisional application No. 62/468,431, filed on Mar. 8, 2017.

(51) Int. Cl.
| | |
|---|---|
| *H01L 23/433* | (2006.01) |
| *H01L 25/18* | (2006.01) |
| *H01L 23/367* | (2006.01) |
| *H01L 23/16* | (2006.01) |
| *H01L 23/36* | (2006.01) |
| *H01L 23/00* | (2006.01) |

(Continued)

(52) U.S. Cl.
CPC ............ *H01L 23/433* (2013.01); *H01L 23/16* (2013.01); *H01L 23/36* (2013.01); *H01L 23/3675* (2013.01); *H01L 23/3677* (2013.01); *H01L 23/5385* (2013.01); *H01L 23/562* (2013.01); *H01L 25/0652* (2013.01); *H01L 25/0655* (2013.01); *H01L 25/18* (2013.01); *H01L 23/3736* (2013.01); *H01L 23/49816* (2013.01); *H01L 23/49827* (2013.01); *H01L 23/5384* (2013.01); *H01L 24/16* (2013.01); *H01L 2224/16227* (2013.01); *H01L 2224/16235* (2013.01); *H01L 2224/73253* (2013.01); *H01L 2225/06517* (2013.01);

(Continued)

(58) Field of Classification Search
CPC ... H01L 23/433; H01L 23/3677; H01L 25/18; H01L 23/3736
See application file for complete search history.

(56) References Cited

U.S. PATENT DOCUMENTS 6,111,313 A    8/2000  Kutlu
7,449,363 B2 *  11/2008  Hsu .................... H01L 23/5389
                                                            257/685

(Continued)

FOREIGN PATENT DOCUMENTS

| CN | 106206482 A | 12/2016 |
|---|---|---|
| CN | 106887414 A | 6/2017 |
| JP | 2004-207415 A | 7/2004 |
| JP | 2004207415 A | 7/2004 |

*Primary Examiner* — Zandra V Smith
*Assistant Examiner* — Andre C Stevenson
(74) *Attorney, Agent, or Firm* — Winston Hsu

(57) ABSTRACT

A semiconductor package includes a package substrate having a top surface and a bottom surface, an interposer mounted on the top surface of the package substrate, a first semiconductor die and a second semiconductor die mounted on the interposer in a side-by-side manner, and a stiffener ring secured to the top surface of the package substrate. The stiffener ring encircles the first semiconductor die and the second semiconductor die. The stiffener ring comprises a reinforcement rib striding across the interposer.

17 Claims, 11 Drawing Sheets

(51) Int. Cl.
  *H01L 25/065* (2006.01)
  *H01L 23/538* (2006.01)
  *H01L 23/373* (2006.01)
  *H01L 23/498* (2006.01)

(52) U.S. Cl.
  CPC ............... *H01L 2225/06541* (2013.01); *H01L 2924/1433* (2013.01); *H01L 2924/1434* (2013.01); *H01L 2924/1436* (2013.01); *H01L 2924/157* (2013.01); *H01L 2924/15192* (2013.01); *H01L 2924/15311* (2013.01); *H01L 2924/3511* (2013.01)

(56) References Cited

U.S. PATENT DOCUMENTS

| | | |
|---|---|---|
| 9,257,364 B2 | 2/2016 | Ahuja |
| 9,627,288 B2 * | 4/2017 | Chen .................... H01L 23/3121 |
| 9,793,187 B2 * | 10/2017 | Lin .......................... H01L 24/97 |
| 9,793,191 B2 * | 10/2017 | Refai-Ahmed ..... H01L 23/3675 |
| 2008/0057625 A1 * | 3/2008 | Chan .................... H01L 21/563 |
| | | 438/113 |
| 2014/0048326 A1 | 2/2014 | Lin |
| 2014/0048951 A1 | 2/2014 | Lin |
| 2014/0134804 A1 | 5/2014 | Kelly |
| 2015/0145114 A1 | 5/2015 | Higgins, III |
| 2015/0357255 A1 | 12/2015 | Lin |
| 2016/0260680 A1 | 9/2016 | Sakata |
| 2017/0053853 A1 * | 2/2017 | Refai-Ahmed ..... H01L 23/3675 |
| 2017/0125375 A1 | 5/2017 | Chinnusamy |
| 2018/0068993 A1 * | 3/2018 | Patel ....................... H01L 25/50 |

* cited by examiner

SEMICONDUCTOR PACKAGE WITH IMPROVED HEAT DISSIPATION

CROSS REFERENCE TO RELATED APPLICATIONS

This application claims priorities from U.S. provisional application No. 62/468,431 filed Mar. 8, 2017, which is included herein in its entirety by reference.

BACKGROUND

The present invention relates generally to semiconductor packaging and, more particularly, to improvements in dissipation of heat from semiconductor devices in such packages.

During operation of an integrated circuit (IC), an IC chip generates heat, thus heating the entire electronics package that contains the chip. Because the performance of the IC chip degrades as its temperature increases, and because high thermal stresses degrade the structural integrity of the electronics package, this heat must be dissipated.

Typically, electronic packages use a metal lid to dissipate heat. The heat from the chip is transferred to the metal lid via a thermally conductive chip/lid interface. The heat is then transferred from the lid to the ambient atmosphere via convection or to a heat sink mounted on the lid.

Heat removal becomes a challenge as the die power consumption, die size and heat density increases with every new generation of microprocessors.

SUMMARY

It is one object of the invention to a semiconductor package with improved dissipation of heat without compromising the structural rigidity of the package.

According to one embodiment, a semiconductor package includes a package substrate having a top surface and a bottom surface, an interposer mounted on the top surface of the package substrate, a first semiconductor die and a second semiconductor die mounted on the interposer in a side-by-side manner, and a stiffener ring secured to the top surface of the package substrate. The stiffener ring encircles the first semiconductor die and the second semiconductor die. The stiffener ring comprises a reinforcement rib striding across the interposer.

The heat sink is directly bonded to the rear surface of the first semiconductor die and the rear surface of the second semiconductor die through a thermal interface material (TIM) layer. The reinforcement rib is integrally connected to the stiffener ring through a downset portion.

According to another embodiment, a semiconductor package includes a package substrate having a top surface and a bottom surface, an interposer mounted on the top surface of the package substrate, a first semiconductor die and a second semiconductor die mounted on the interposer in a side-by-side manner, a molding compound encapsulating the first semiconductor die and the second semiconductor die, and a stiffener ring secured to the top surface of the package substrate, wherein the stiffener ring comprises a reinforcement rib striding across the molding compound.

A heat sink is directly bonded to the rear surface of the first semiconductor die, the rear surface of the second semiconductor die, and a top surface of the reinforcement rib through a thermal interface material (TIM) layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described insufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

Figure 1:
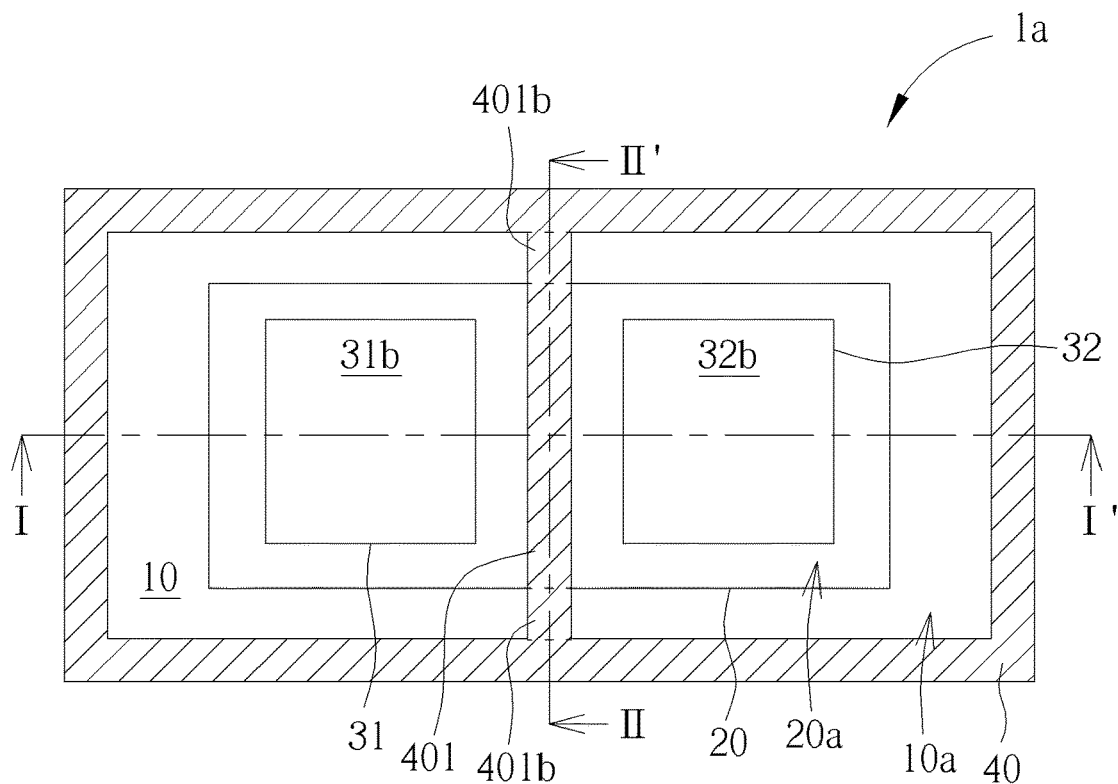
FIG. 1 is a schematic, top view of a semiconductor package according to one embodiment of the invention.
Figure 2:
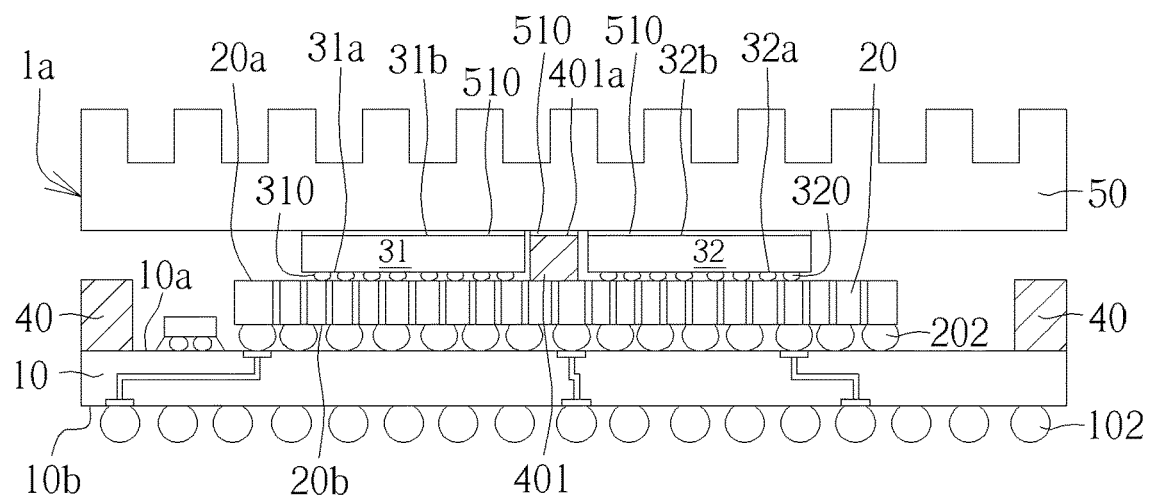
FIG. 2 is a schematic, cross-sectional diagram taken alone line I-I' in FIG. 1.
Figure 3:
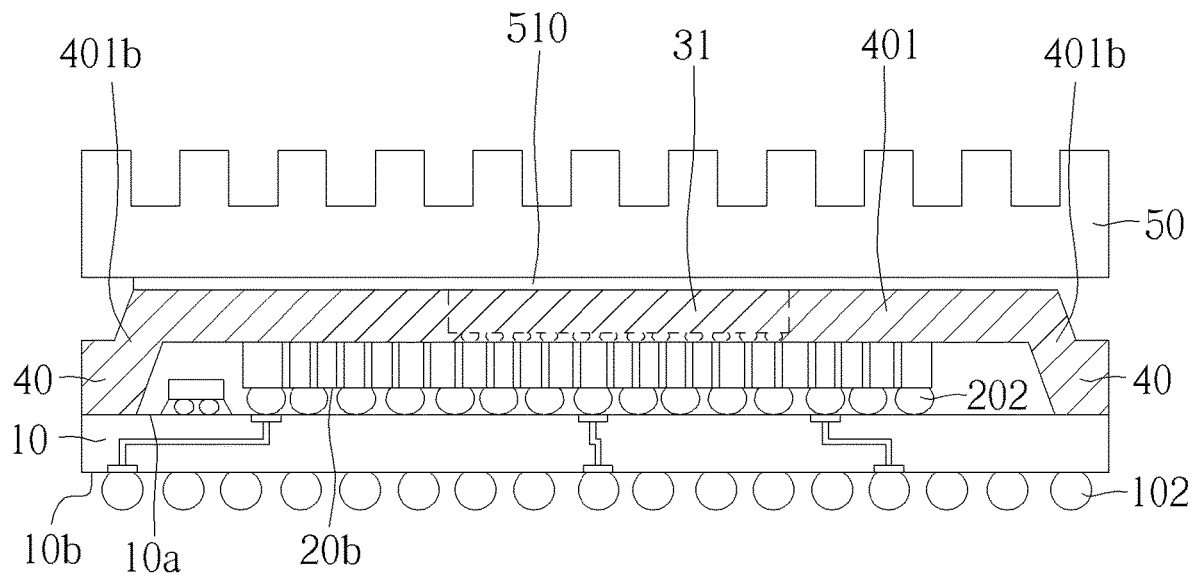
FIG. 3 is a schematic, cross-sectional diagram taken alone line II-II' in FIG. 1.

Please refer to FIG. 1 to FIG. 3. FIG. 1 is a schematic, top view of a semiconductor package according to one embodiment of the invention. FIG. 2 is a schematic, cross-sectional diagram taken alone line I-I' in FIG. 1. FIG. 3 is a schematic, cross-sectional diagram taken alone line II-II' in FIG. 1.

As shown in FIG. 1 to FIG. 3, a semiconductor package 1a is provided. The semiconductor package 1a may be a 2.5 D semiconductor package. The semiconductor package 1a comprises a package substrate 10 having a top surface 10a and a bottom surface 10b. An interposer 20 is mounted on the top surface 10a of the package substrate 10. According to one embodiment, the interposer 20 may comprise a silicon interposer or an RDL (re-distribution layer) interposer, but is not limited thereto.

On the bottom surface 10b, a plurality of connecting elements 102 may be provided. For example, the plurality of connecting elements 102 may be sober balls. Through the plurality of connecting elements 102, the semiconductor package 1a may be mounted to a printed circuit board or system board, but is not limited thereto.

A first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively. The interposer 20 provides electrical connections between the dies 31, 32 and the package substrate 10, and possibly between the dies 31, 32 themselves.

According to one embodiment, the first semiconductor die 31 may comprise an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked.

It is understood that the first semiconductor die 31 and the second semiconductor die 32 may be both an ASIC or both a System-on-Chip (SoC) chip. According to another embodiment, the first semiconductor die 31 and the second semiconductor die 32 may comprise a SoC and a DRAM die. According to another embodiment, the first semiconductor die 31 and the second semiconductor die 32 may comprise an ASIC and an HBM chip.

It is to be understood that the number of the semiconductor dies in the figures are for illustration purposes only. The number of the semiconductor dies is not limited to two and may exceed two.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises a reinforcement rib 401 striding across the interposer 20. According to one embodiment, as can be seen in FIG. 3, the reinforcement rib 401 is integrally connected to the stiffener ring 40 through a downset portion 401b. The reinforcement rib 401 extends through a space between the first semiconductor die 31 and the second semiconductor die 32. The reinforcement rib 401 is in direct contact with the top surface 20a of the interposer 20.

According to one embodiment, no molding compound is used to cover the interposer 20, the first semiconductor die 31, and the second semiconductor die 32. As can be seen in FIG. 1, the reinforcement rib 401 is interposed between the first semiconductor die 31 and the second semiconductor die 32 from the top view of this embodiment. The reinforcement rib 401 is coplanar with the first semiconductor die 31 and the second semiconductor die 32

According to one embodiment, as can be seen in FIG. 2 and FIG. 3, the semiconductor package 1a may further comprise a heat sink 50. The heat sink 50 may be directly bonded to a rear surface 31b of the first semiconductor die 31, a rear surface 32b of the second semiconductor die 32, and/or a top surface 401a of the reinforcement rib 401 through a thermal interface material (TIM) layer 510. For the sake of clarity, the heat sink 50 is not shown in FIG. 1.

The heat sink 50 may be also bonded to the reinforcement rib 401 between the first semiconductor die 31 and the second semiconductor die 32, which helps to dissipate heat. According to another embodiment, the first semiconductor die 31 and/or the second semiconductor die 32 may be in thermal contact with the reinforcement rib 401.

Figure 4:
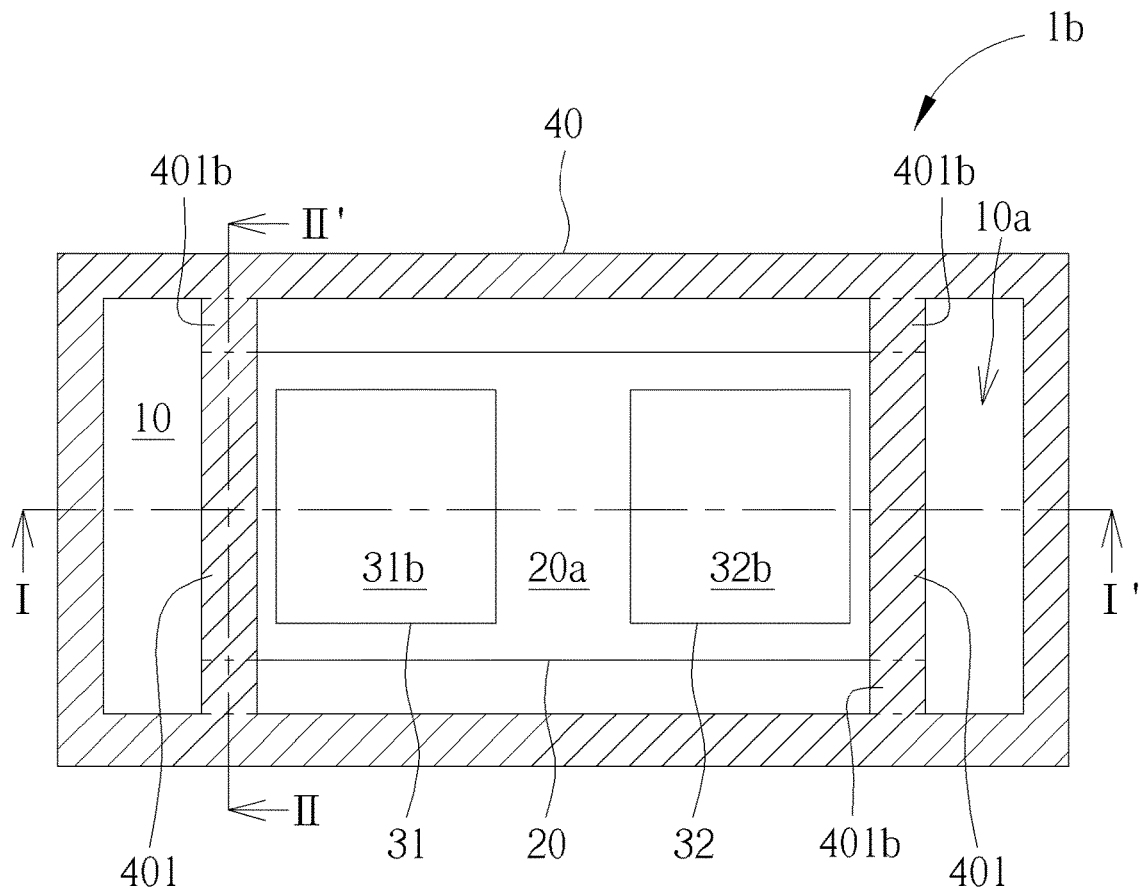
FIG. 4 is a schematic, top view of a semiconductor package according to another embodiment of the invention.
Figure 5:
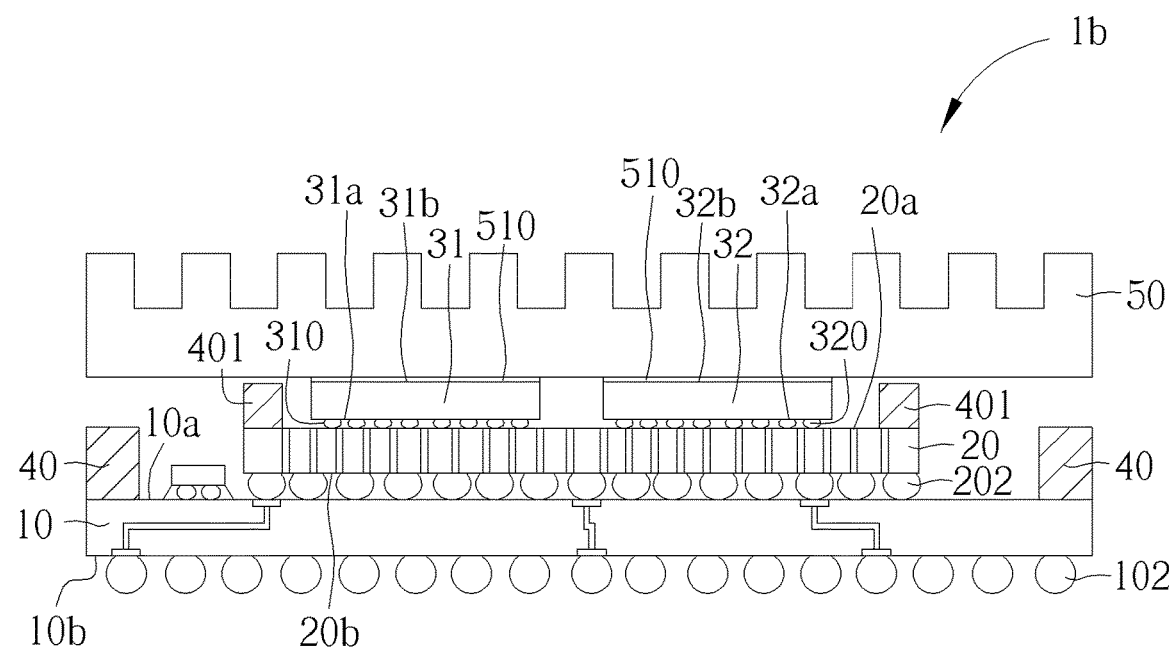
FIG. 5 is a schematic, cross-sectional diagram taken alone line I-I' in FIG. 4.
Figure 6:
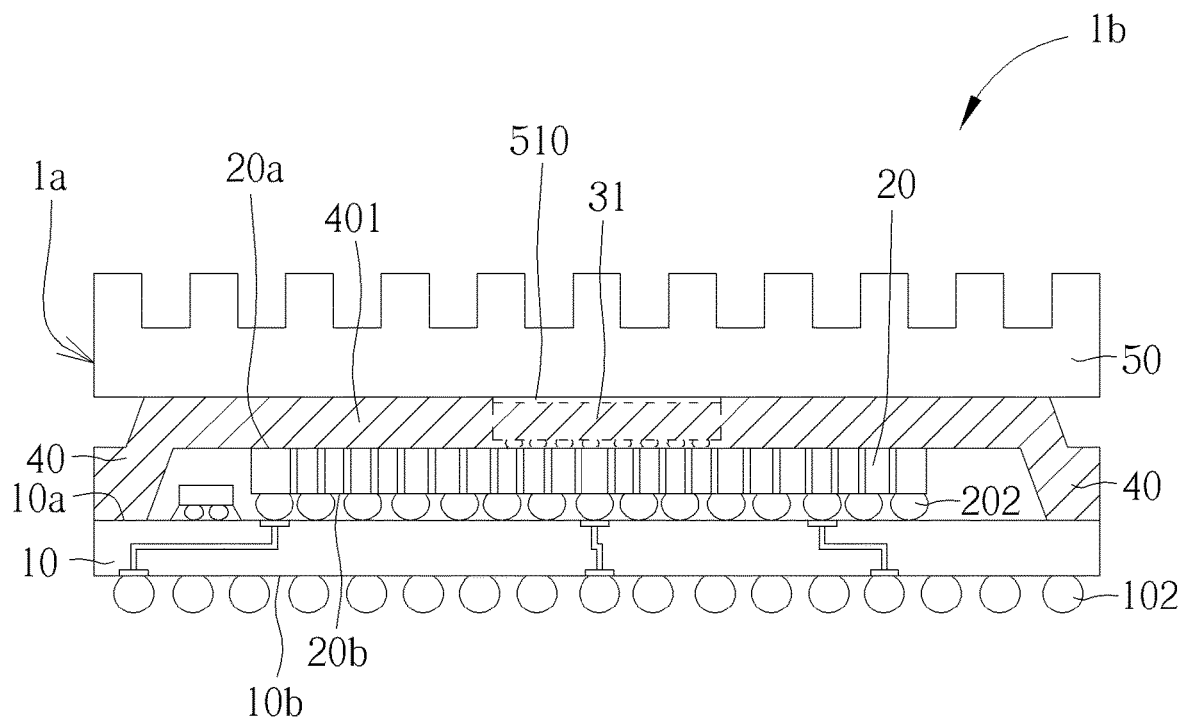
FIG. 6 is a schematic, cross-sectional diagram taken alone line II-II' in FIG. 4.

FIG. 4, FIG. 5, and FIG. 6 illustrate another embodiment of the invention, wherein like numeral numbers designate like regions, layers, or elements.

FIG. 4 is a schematic, top view of a semiconductor package according to another embodiment of the invention. FIG. 5 is a schematic, cross-sectional diagram taken alone line I-I' in FIG. 4. FIG. 6 is a schematic, cross-sectional diagram taken alone line II-II' in FIG. 4.

As shown in FIG. 4 to FIG. 6, a semiconductor package 1b is provided. The semiconductor package 1b may be a 2.5 D semiconductor package. The semiconductor package 1b comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer.

On the bottom surface 10b, a plurality of connecting elements 102 may be provided. For example, the plurality of connecting elements 102 may be sober balls. Through the plurality of connecting elements 102, the semiconductor package 1b may be mounted to a printed circuit board or system board.

Likewise, a first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively.

According to one embodiment, the first semiconductor die 31 may comprise an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked. According to one embodiment, the first semiconductor die 31 is disposed in close proximity to the second semiconductor die 32. For example, typically, a gap between first semiconductor die 31 and the second semiconductor die 32 may be smaller than 100 micrometers.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises two reinforcement ribs 401 striding across the interposer 20. The two reinforcement ribs 401 circumvent the first semiconductor die 31 and the second semiconductor die 32. According to one embodiment, as can be seen in FIG. 4 and FIG. 6, the reinforcement ribs 401 are integrally connected to the stiffener ring 40 through downset portions 401b. The reinforcement ribs 401 extend along the two opposite side edges of the interposer 20. The reinforcement ribs 401 are in direct contact with the top surface 20a of the interposer 20. According to one embodiment, no molding compound is used to cover the interposer 20, the first semiconductor die 31, and the second semiconductor die 32. Each of the reinforcement ribs 401 does not overlap with the first semiconductor die 31 or the second semiconductor die 32.

According to one embodiment, as can be seen in FIG. 5 and FIG. 6, the semiconductor package 1b may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 4.

The heat sink 50 may be also bonded to the reinforcement rib 401 between the first semiconductor die 31 and the second semiconductor die 32, which helps to dissipate heat. According to another embodiment, the first semiconductor die 31 and/or the second semiconductor die 32 may be in thermal contact with the reinforcement rib 401.

Figure 18:
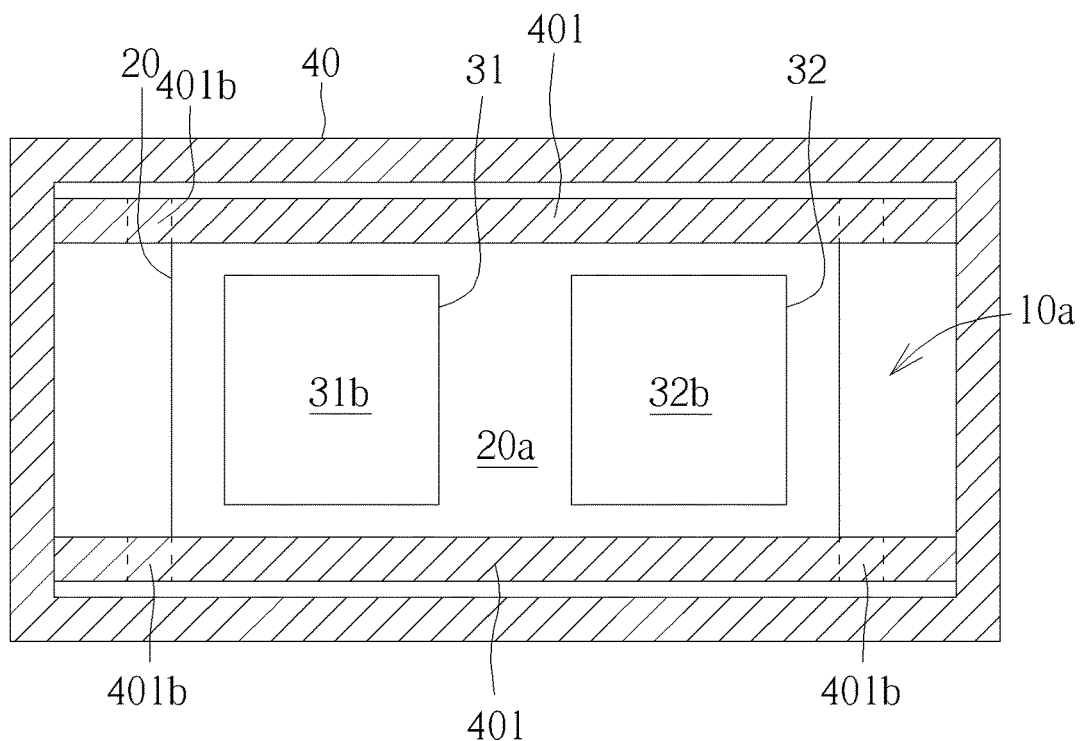
FIG. 18 is a schematic, top view of a semiconductor package according to still another embodiment of the invention, wherein the reinforcement ribs extend along a horizontal direction.

It is understood that the two reinforcement ribs 401 may extend along a direction that is different from the vertical direction as shown in FIG. 4. For example, as shown in FIG. 18, the two reinforcement ribs 401 may extend along a horizontal direction along two opposite sides of the each of the first semiconductor die 31 and the second semiconductor die 32.

Figure 7:
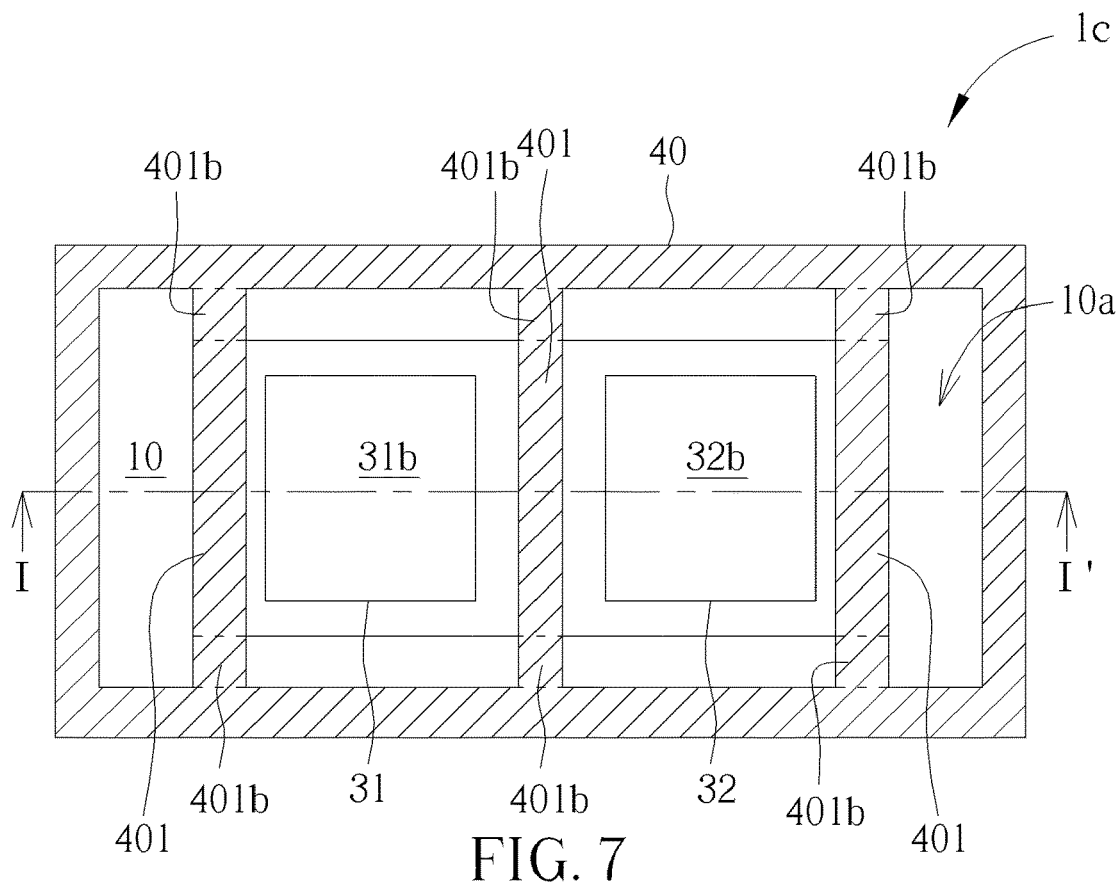
FIG. 7 is a schematic, top view of a semiconductor package according to another embodiment of the invention.
Figure 8:
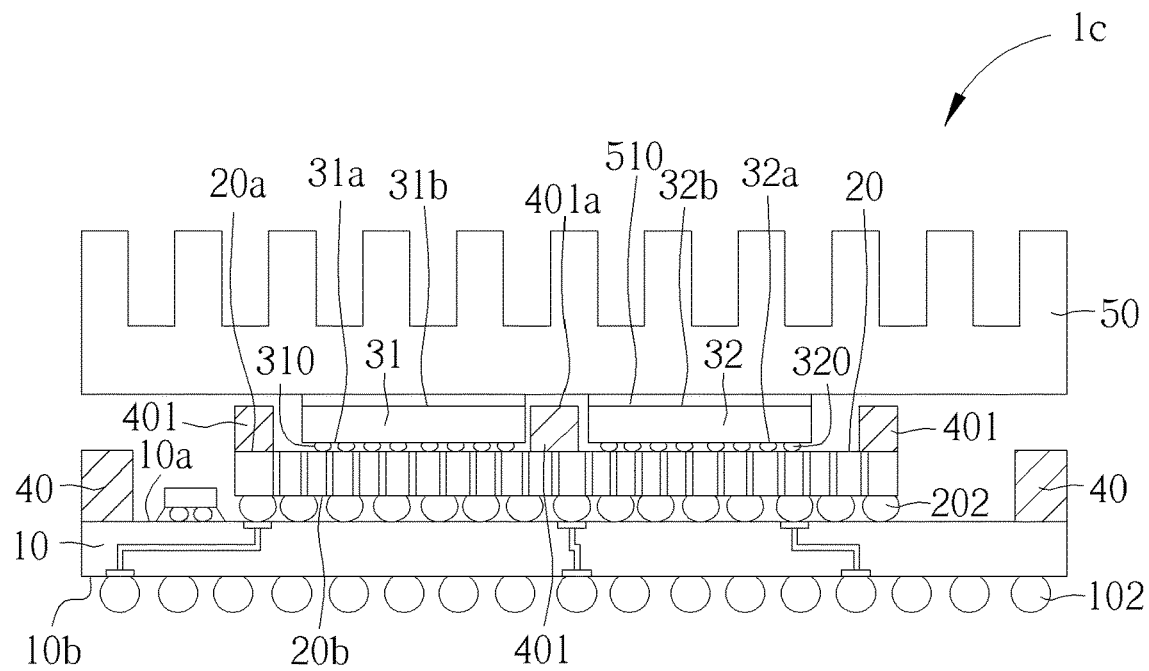
FIG. 8 is a schematic, cross-sectional diagram taken alone line I-I' in FIG. 7.

FIG. 7 and FIG. 8 show another embodiment of the invention, wherein like numeral numbers designate like regions, layers, or elements. FIG. 7 is a schematic, top view of a semiconductor package according to another embodiment of the invention. FIG. 8 is a schematic, cross-sectional diagram taken alone line I-I' in FIG. 7.

As shown in FIG. 7 and FIG. 8, a semiconductor package 1c is provided. The semiconductor package 1c may be a 2.5 D semiconductor package. The semiconductor package 1c comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the stiffener ring 40 comprises three reinforcement ribs 401 striding across the interposer 20. According to one embodiment, as can be seen in FIG. 7, the reinforcement ribs 401 are integrally connected to the stiffener ring 40 through downset portions 401b. Two of the three reinforcement ribs 401 extend along the two opposite side edges of the interposer 20. One of the three reinforcement ribs 401 extends through a space between the first semiconductor die 31 and the second semiconductor die 32. The reinforcement ribs 401 are in direct contact with the top surface 20a of the interposer 20. According to one embodiment, no molding compound is used to cover the interposer 20, the first semiconductor die 31, and the second semiconductor die 32.

According to one embodiment, as can be seen in FIG. 8, the semiconductor package 1c may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 7.

Figure 9:
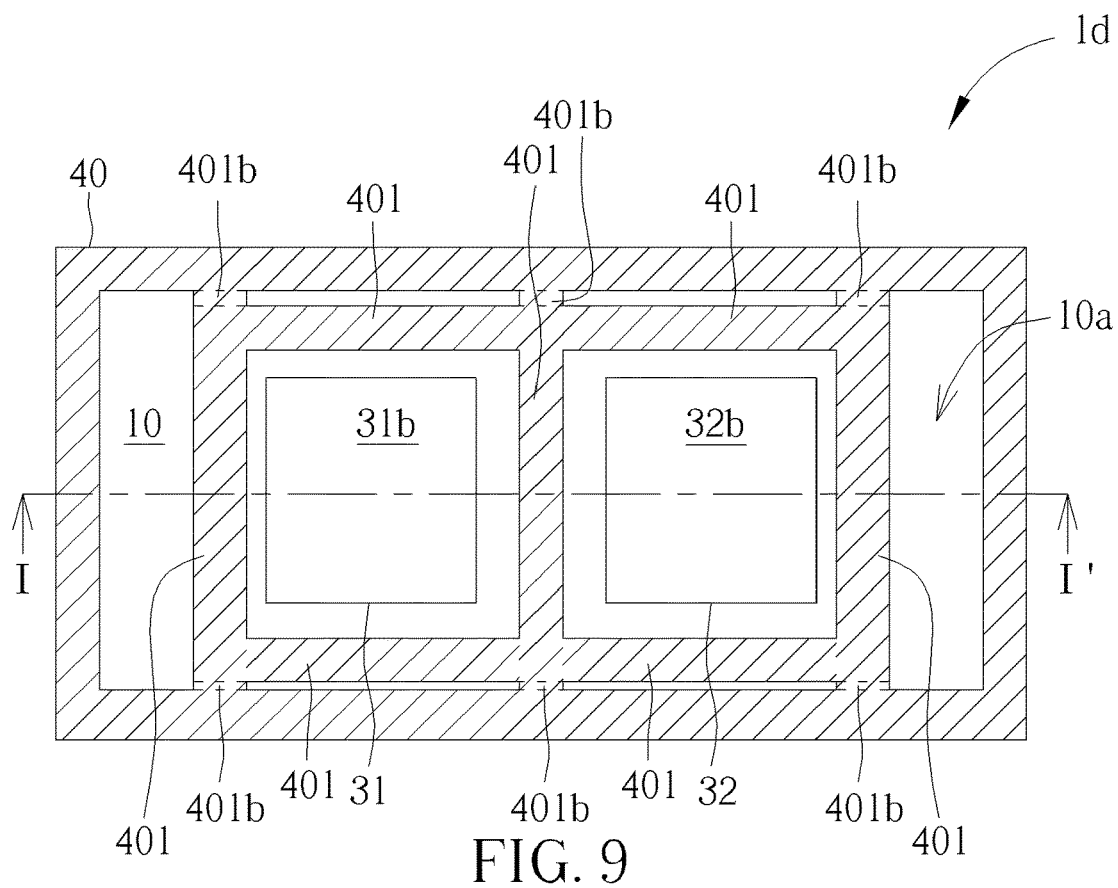
FIG. 9 is a schematic, top view of a semiconductor package according to another embodiment of the invention.
Figure 10:
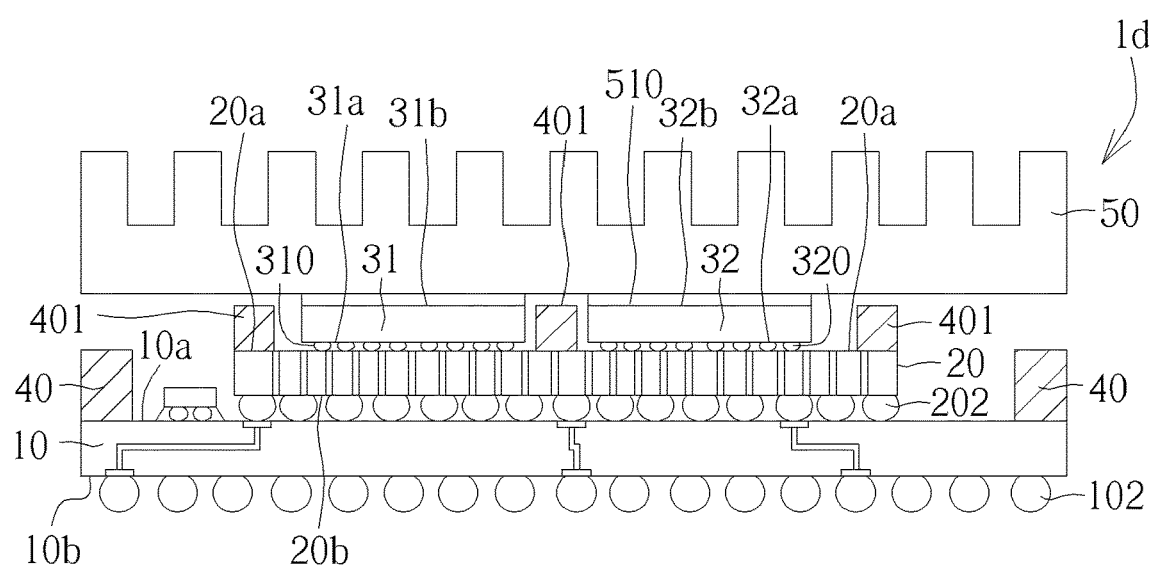
FIG. 10 is a schematic, cross-sectional diagram taken alone line I-I' in FIG. 9.

FIG. 9 and FIG. 10 show another embodiment of the invention, wherein like numeral numbers designate like regions, layers, or elements. FIG. 9 is a schematic, top view of a semiconductor package according to another embodiment of the invention. FIG. 10 is a schematic, cross-sectional diagram taken alone line I-I' in FIG. 9.

As shown in FIG. 9 and FIG. 10, a semiconductor package 1d is provided. The semiconductor package 1d may be a 2.5 D semiconductor package. The semiconductor package 1d comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the stiffener ring 40 comprises multiple reinforcement ribs 401 striding across the interposer 20. The multiple reinforcement ribs 401 may be shaped into frames that encircle the first semiconductor die 31 and the second semiconductor die 32. According to one embodiment, as can be seen in FIG. 9, the reinforcement ribs 401 are integrally connected to the stiffener ring 40 through downset portions 401b. The reinforcement ribs 401 are in direct contact with the top surface 20a of the interposer 20.

According to one embodiment, no molding compound is used to cover the interposer 20, the first semiconductor die 31, and the second semiconductor die 32.

According to one embodiment, as can be seen in FIG. 10, the semiconductor package 1d may further comprise a heat sink 50. The heat sink 50 may be directly bonded to a rear surface 31b of the first semiconductor die 31, a rear surface 32b of the second semiconductor die 32 through a thermal interface material (TIM) layer 510. For the sake of clarity, the heat sink 50 is not shown in FIG. 9.

Figure 11:
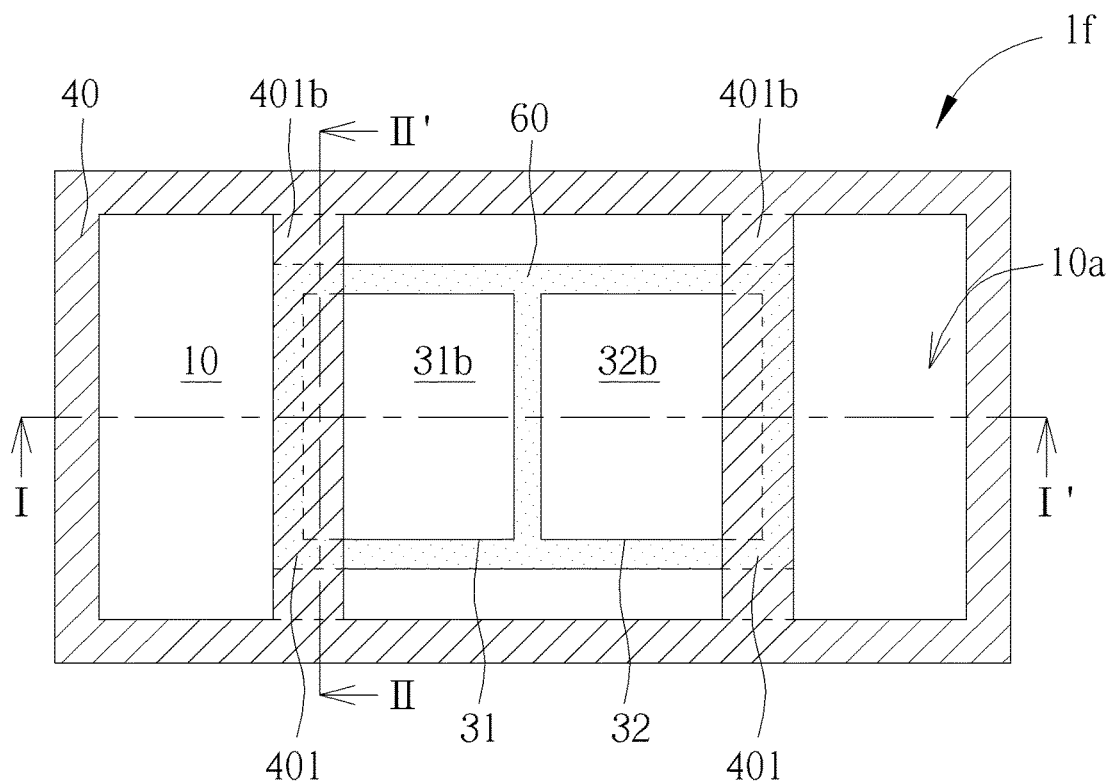
FIG. 11 is a schematic, top view of a semiconductor package according to another embodiment of the invention.
Figure 12:
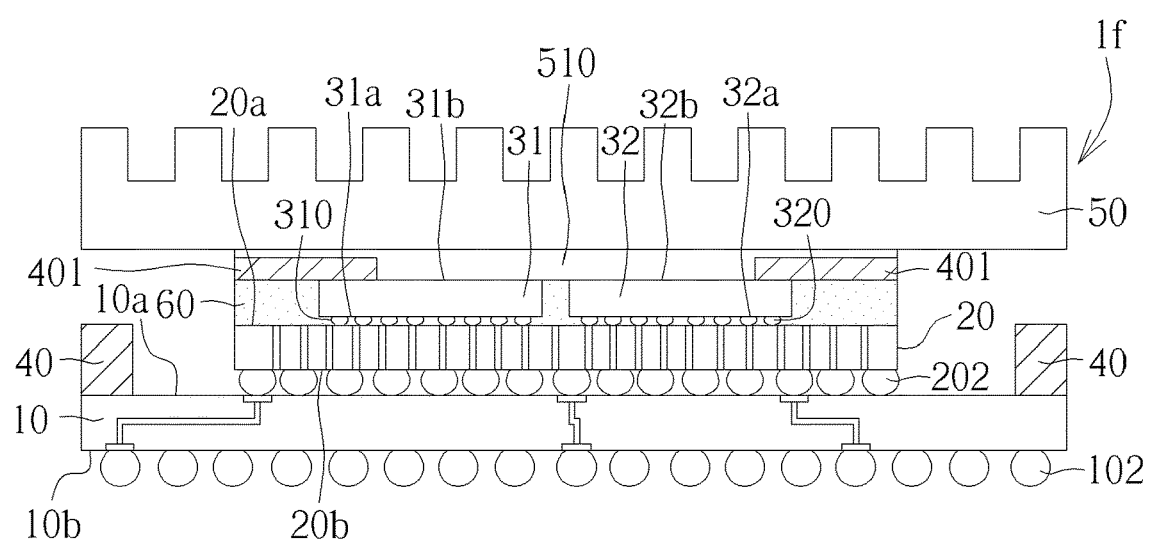
FIG. 12 is a schematic, cross-sectional diagram taken alone line I-I' in FIG. 11.
Figure 13:
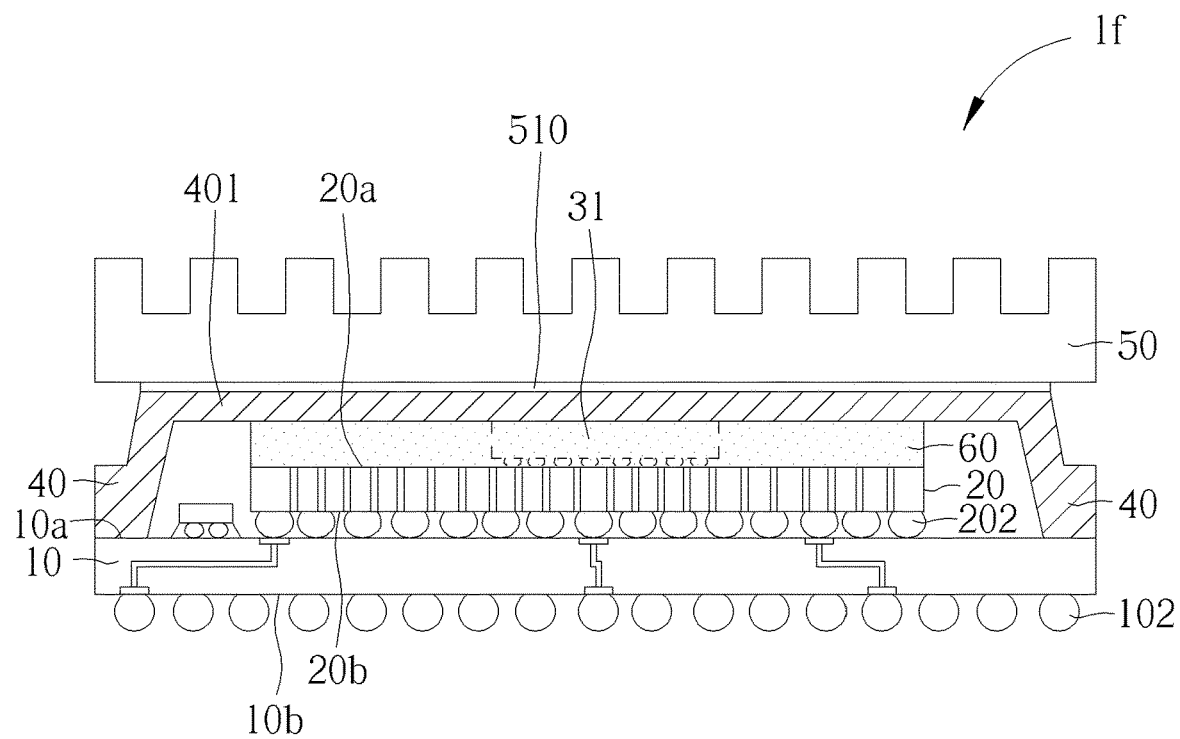
FIG. 13 is a schematic, cross-sectional diagram taken alone line II-II' in FIG. 11.

FIG. 11, FIG. 12, and FIG. 13 show another embodiment of the invention, wherein like numeral numbers designate like regions, layers, or elements. FIG. 11 is a schematic, top view of a semiconductor package according to another embodiment of the invention. FIG. 12 is a schematic, cross-sectional diagram taken alone line I-I' in FIG. 11. FIG. 13 is a schematic, cross-sectional diagram taken alone line II-II' in FIG. 11.

As shown in FIG. 11 to FIG. 13, a semiconductor package if is provided. The semiconductor package if may be a 2.5 D semiconductor package. The semiconductor package if comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

On the bottom surface 10b, a plurality of connecting elements 102 may be provided. For example, the plurality of connecting elements 102 may be sober balls. Through the plurality of connecting elements 102, the semiconductor package if may be mounted to a printed circuit board or system board, but is not limited thereto.

Likewise, a first semiconductor die 31 and a second semiconductor die 32 are mounted on a top surface 20a of the interposer 20 in a side-by-side manner. The first semiconductor die 31 and the second semiconductor die 32 may be flip chips with their active surfaces 31a and 32a facing down to the interposer 20. The first semiconductor die 31 and the second semiconductor die 32 may be connected to the interposer 20 through the bumps 310 and bumps 320 on their active surfaces 31a and 32a, respectively.

According to one embodiment, the first semiconductor die 31 may comprise an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked.

It is understood that the first semiconductor die 31 and the second semiconductor die 32 may be both ASIC or both System-on-Chip (SoC) chip. According to another embodiment, the first semiconductor die 31 and the second semiconductor die 32 may comprise a SoC and a DRAM die. According to another embodiment, the first semiconductor die 31 and the second semiconductor die 32 may comprise an ASIC and an HBM chip. Although only two semiconductor dies are illustrated in the figures, it is understood that the semiconductor package may comprise more than two semiconductor dies in other embodiments.

On the bottom surface 20b of the interposer 20, a plurality of connecting elements 202 are provided. Through the connecting elements 202, the interposer 20 is electrically connected to the package substrate 10. The first semiconductor die 31 and the second semiconductor die 32 are electrically connected to the package substrate 10 through the interposer 20. In some embodiments, the first semiconductor die 31 and the second semiconductor die 32 may be electrically connected to each other through the interposer 20.

According to one embodiment, a molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32.

According to one embodiment, the stiffener ring 40 may be secured to the top surface 10a of the package substrate 10 by using an adhesive layer, but is not limited thereto. The stiffener ring 40 may be composed of copper, but is not limited thereto.

According to one embodiment, the stiffener ring 40 comprises two reinforcement ribs 401 striding across the molding compound 60. According to one embodiment, as can be seen in FIG. 11 and FIG. 13, the reinforcement ribs 401 are integrally connected to the stiffener ring 40 through downset portions 401b. The reinforcement ribs 401 extend along the two opposite side edges of the interposer 20. The reinforcement ribs 401 are in direct contact with the top surface 20a of the molding compound 60.

According to one embodiment, the semiconductor package if may further comprise a heat sink 50. The heat sink 50 may be directly bonded to a rear surface 31b of the first semiconductor die 31, a rear surface 32b of the second semiconductor die 32, and a top surface 401a of the reinforcement rib 401 through a thermal interface material (TIM) layer 510. As can be seen in FIG. 11, the reinforcement ribs 401 may partially overlap with the rear surface of the first semiconductor die 31 or the second semiconductor die 32. For the sake of clarity, the heat sink 50 is not shown in FIG. 11. According to one embodiment, the reinforcement ribs 401 may be in direct contact with the rear surface of the first semiconductor die 31 or the second semiconductor die 32.

Figure 19:
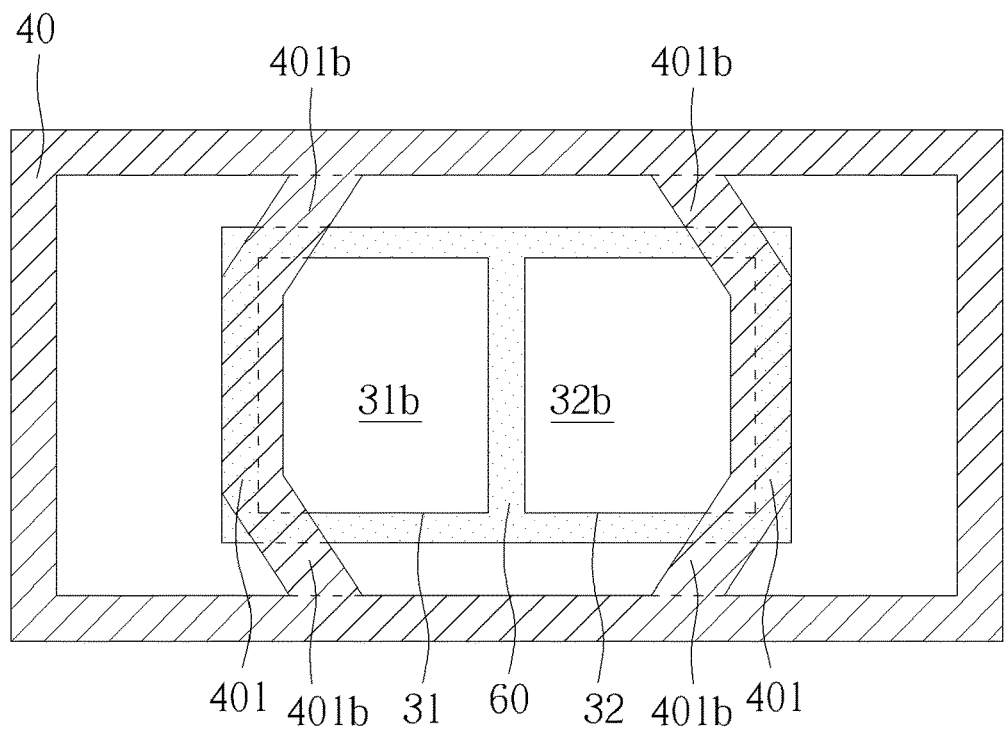
FIG. 19 is a schematic, top view of a semiconductor package according to still another embodiment of the invention, wherein the reinforcement ribs form an octagonal structure with the surrounding stiffener ring.
Figure 20:
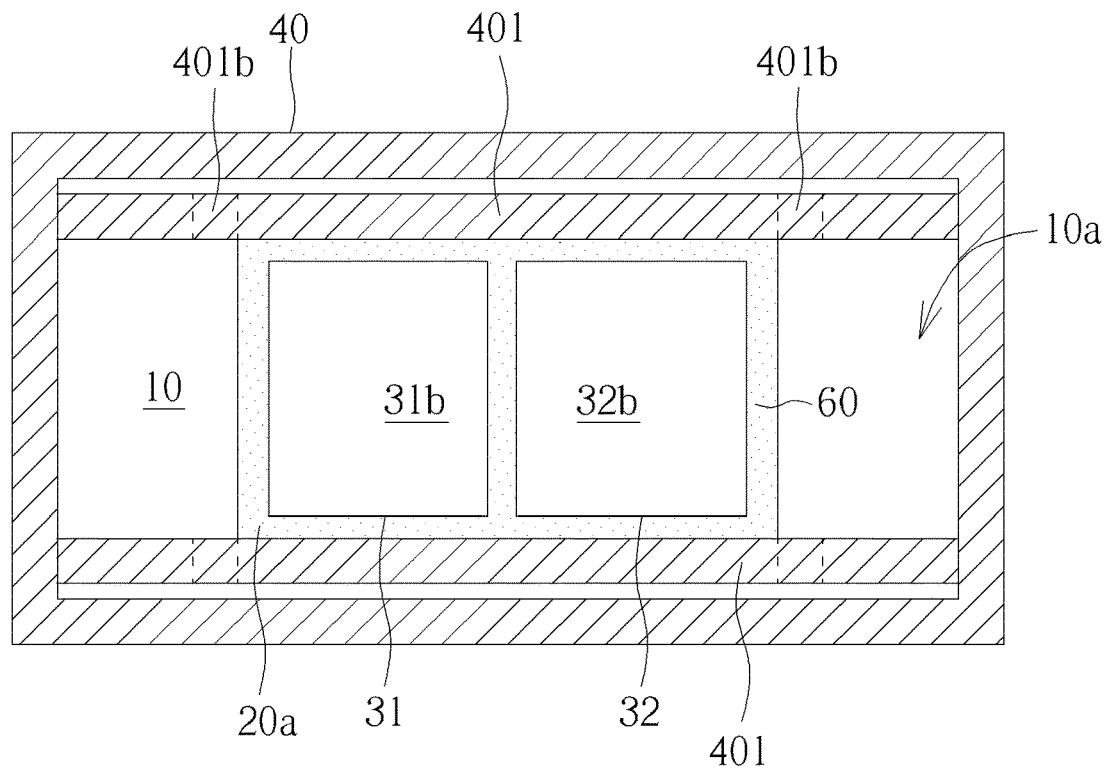
FIG. 20 is a schematic, top view of a semiconductor package according to still another embodiment of the invention, wherein the reinforcement ribs extend along a horizontal direction.

According to one embodiment, the reinforcement ribs 401 may be a straight-line shaped rib across the molding compound 60 when viewed from the above. However, it is understood that the reinforcement ribs 401 may have other shapes. For example, in FIG. 19, the reinforcement ribs 401 are bent so as to form an octagonal structure with the surrounding stiffener ring 40. Such octagonal structure may provide better structural rigidity for the semiconductor package.

Figure 14:
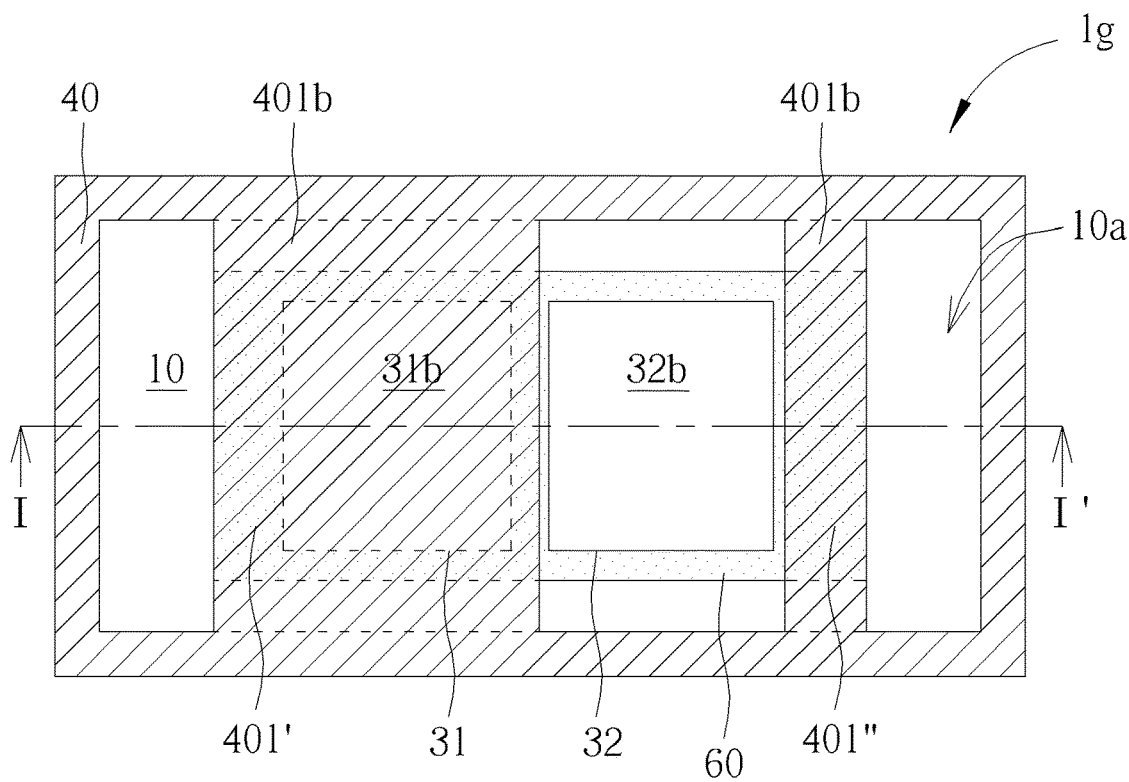
FIG. 14 is a schematic, top view of a semiconductor package according to another embodiment of the invention.
Figure 15:
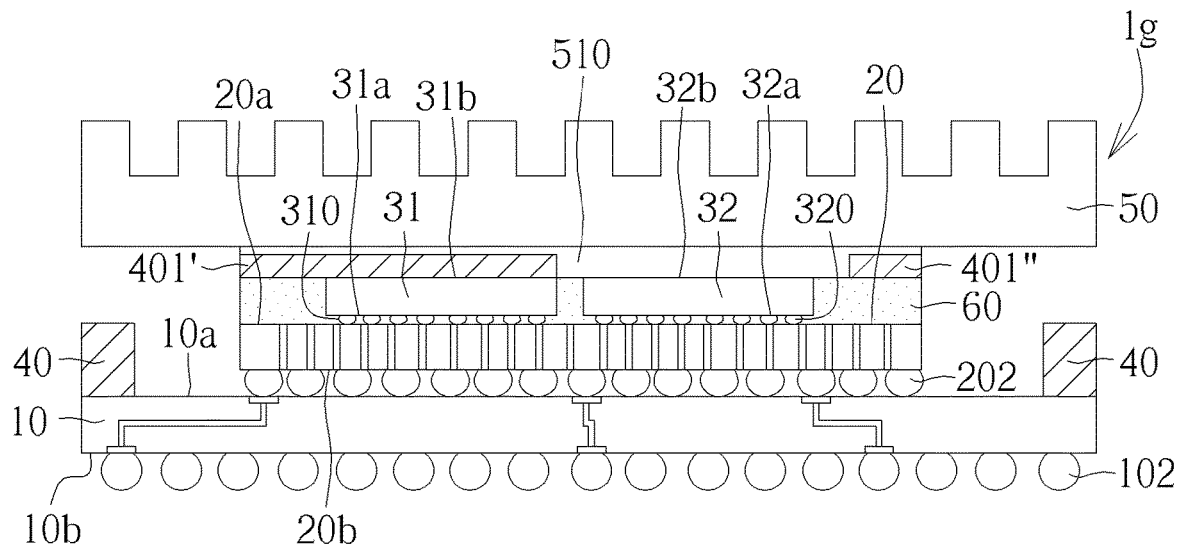
FIG. 15 is a schematic, cross-sectional diagram taken alone line I-I' in FIG. 14.

FIG. 14 and FIG. 15 show another embodiment of the invention, wherein like numeral numbers designate like regions, layers, or elements. FIG. 14 is a schematic, top view of a semiconductor package according to another embodiment of the invention. FIG. 15 is a schematic, cross-sectional diagram taken alone line I-I' in FIG. 14.

As shown in FIG. 14 and FIG. 15, a semiconductor package 1g is provided. The semiconductor package 1g may be a 2.5 D semiconductor package. The semiconductor package 1g comprises a package substrate 10 having a top surface 10a and a bottom surface 10b. An interposer 20 is mounted on the top surface 10a of the package substrate 10.

According to one embodiment, the interposer 20 may comprise a silicon interposer or an RDL interposer, but is not limited thereto.

According to one embodiment, the molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, the stiffener ring 40 comprises two reinforcement ribs 401' and 401" striding across the molding compound 60. According to one embodiment, as can be seen in FIG. 14, the reinforcement ribs 401' and 401" are integrally connected to the stiffener ring 40 through downset portions 401b. An asymmetric reinforcement rib configuration may be employed. For example, the three reinforcement rib 401' has a greater width (or surface area) than that of the reinforcement rib 401".

According to one embodiment, for example, the reinforcement rib 401' may completely overlap with the rear surface 31b of the first semiconductor die 31. For example, the reinforcement rib 401" may extend along a side edge of the interposer 20 and may not overlap with the second semiconductor die 32 when viewed from the above.

Figure 16:
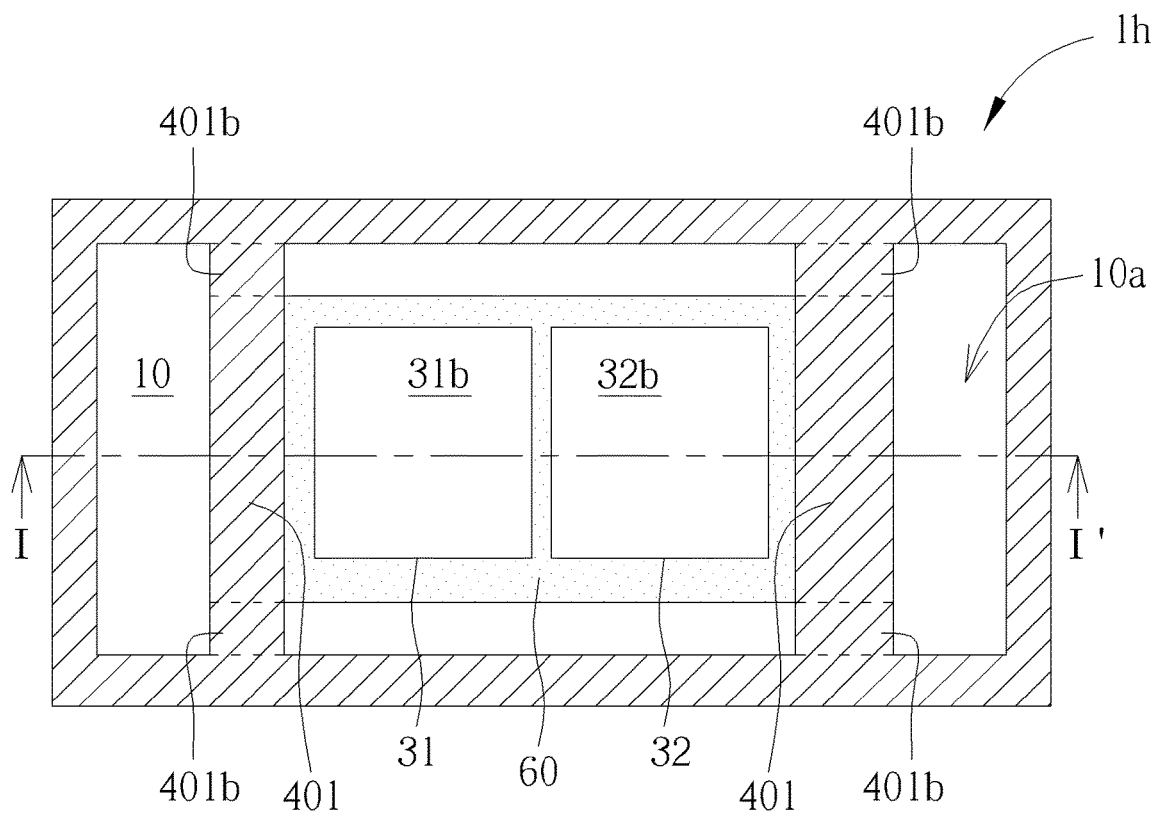
FIG. 16 is a schematic, top view of a semiconductor package according to another embodiment of the invention.
Figure 17:
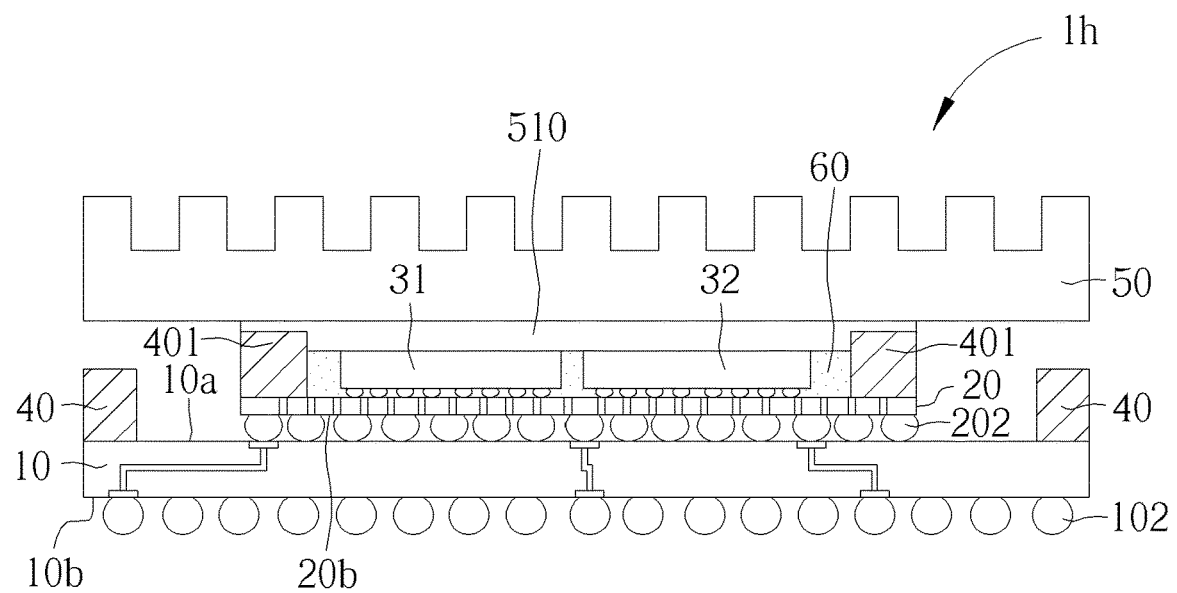
FIG. 17 is a schematic, cross-sectional diagram taken alone line I-I' in FIG. 16.

FIG. 16 and FIG. 17 show another embodiment of the invention, wherein like numeral numbers designate like regions, layers, or elements. FIG. 16 is a schematic, top view of a semiconductor package according to another embodiment of the invention. FIG. 17 is a schematic, cross-sectional diagram taken alone line I-I' in FIG. 16.

As shown in FIG. 16 and FIG. 17, a semiconductor package 1h is provided. The semiconductor package 1h may be a 2.5 D semiconductor package. The semiconductor package 1h comprises a package substrate 10 having a top surface 10a and a bottom surface 10b. An interposer 20 is mounted on the top surface 10a of the package substrate 10. According to one embodiment, the interposer 20 may comprise a silicon interposer or an RDL interposer, but is not limited thereto.

According to one embodiment, the molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to one embodiment, the stiffener ring 40 comprises two reinforcement ribs 401 striding across the interposer 20. According to one embodiment, as can be seen in FIG. 16, the reinforcement ribs 401 are integrally connected to the stiffener ring 40 through downset portions 401b. As can be seen in FIG. 17, the reinforcement ribs 401 are in direct contact with the top surface 20a of the interposer 20 and the peripheral sidewalls of the molding compound 60. The reinforcement rib 401, the first semiconductor die 31 and the second semiconductor die 32 may be in thermal contact with the heat sink 50 through the thermal interface material (TIM) layer 510.

Figure 21:
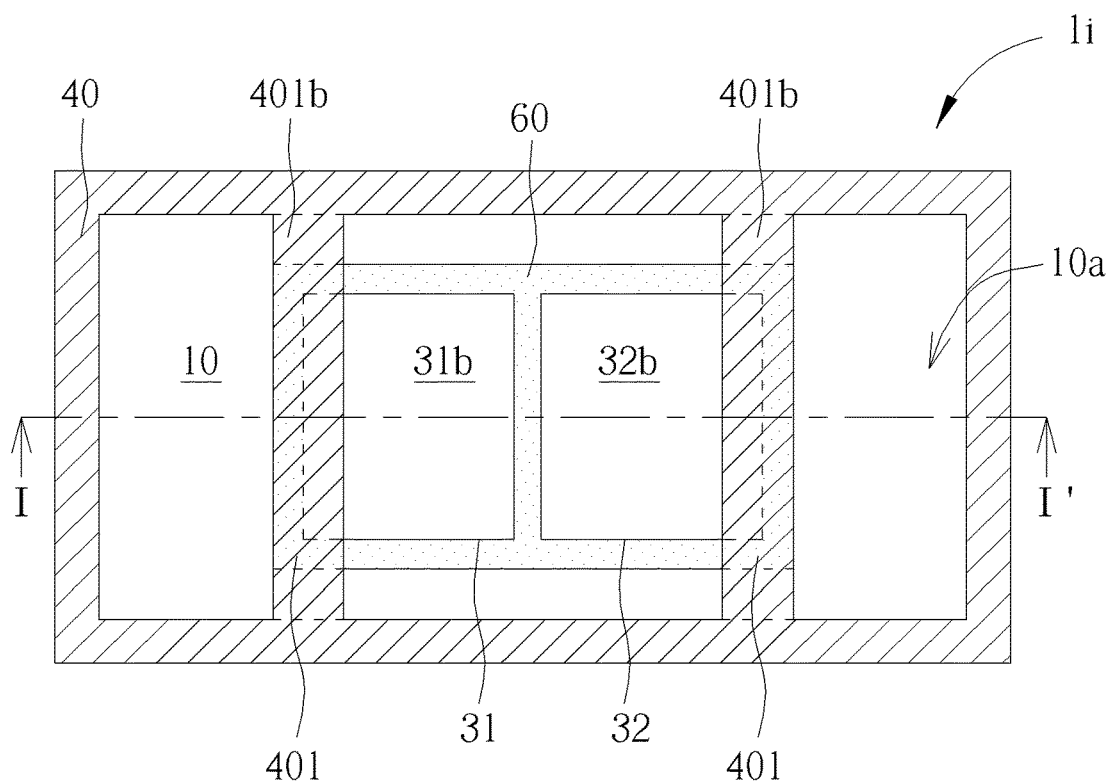
FIG. 21 is a schematic, top view of a semiconductor package according to yet another embodiment of the invention.
Figure 22:
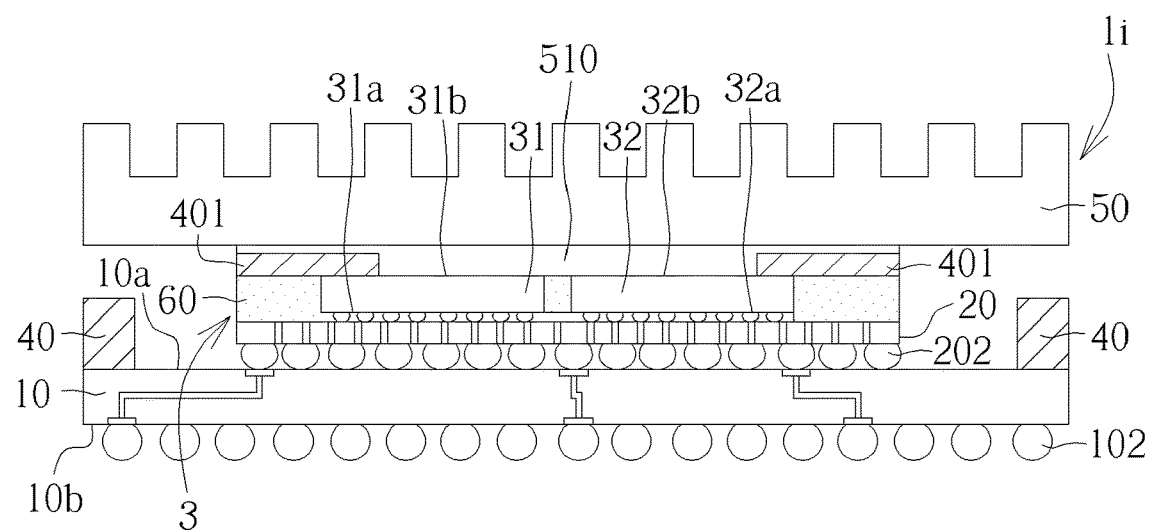
FIG. 22 is a schematic, cross-sectional diagram taken alone line I-I' in FIG. 21.

FIG. 21 and FIG. 22 show another embodiment of the invention, wherein like numeral numbers designate like regions, layers, or elements. FIG. 21 is a schematic, top view of a semiconductor package according to yet another embodiment of the invention. FIG. 22 is a schematic, cross-sectional diagram taken alone line I-I' in FIG. 21.

As shown in FIG. 21 and FIG. 22, a semiconductor package 1i is provided. The semiconductor package 1i may comprise a 2.5 D fan-out semiconductor package 3. The semiconductor package 1i comprises a package substrate 10 having a top surface 10a and a bottom surface 10b. The 2.5 D fan-out semiconductor package 3 is mounted on the top surface 10a. The first semiconductor die 31 and the second semiconductor die 32 are interconnected through a re-distribution layer (RDL) structure 21. The RDL structure 21 is formed on the molding compound 60 and the active surfaces 31a and 32a of the first semiconductor die 31 and the second semiconductor die 32 to directly connect to the bond pads of the first semiconductor die 31 and the second semiconductor die 32.

According to one embodiment, the first semiconductor die 31 may comprise an application-specific integrated chip (ASIC) or a micro-processor, but is not limited thereto. The second semiconductor die 32 may comprise a high bandwidth memory (HBM) chip in which a plurality of memory chips having through silicon vias (TSVs) are stacked.

On the bottom surface 20b of the RDL structure 21, a plurality of connecting elements 202 are provided. Through the connecting elements 202, the RDL structure 21 is electrically connected to the package substrate 10. The molding compound 60 is provided to encapsulate the first semiconductor die 31 and the second semiconductor die 32. The rear surface 31b of the first semiconductor die 31 and the rear surface 32b of the second semiconductor die 32 are not covered by the molding compound 60.

According to the embodiment, a stiffener ring 40 is secured to the top surface 10a of the package substrate 10. The stiffener ring 40 may be disposed along the perimeter of the package substrate 10 so as to form a rectangular shape, for example. The stiffener ring 40 encircles the first semiconductor die 31 and the second semiconductor die 32. According to the embodiment, the stiffener ring 40 may be secured to the top surface 10a of the package substrate 10 by using an adhesive layer, but is not limited thereto. The stiffener ring 40 may be composed of copper, but is not limited thereto.

The stiffener ring 40 may comprise two reinforcement ribs 401 striding across the molding compound 60. As can be seen in FIG. 21, the reinforcement ribs 401 are integrally connected to the stiffener ring 40 through downset portions 401b. The reinforcement ribs 401 extend along the two opposite side edges of the 2.5 D fan-out semiconductor package 3. The reinforcement ribs 401 are in direct contact with the top surface 20a of the molding compound 60.

The heat sink 50 may be directly bonded to a rear surface 31b of the first semiconductor die 31, a rear surface 32b of the second semiconductor die 32, and a top surface 401a of the reinforcement rib 401 through the thermal interface material layer 510. As can be seen in FIG. 21, the reinforcement ribs 401 may partially overlap with the rear surface of the first semiconductor die 31 or the second semiconductor die 32. For the sake of clarity, the heat sink 50 is not shown in FIG. 21. The reinforcement ribs 401 may be in direct contact with the rear surface of the first semiconductor die 31 or the second semiconductor die 32. The reinforcement ribs 401 may be a straight-line shaped rib across the molding compound 60 when viewed from the above. However, it is understood that the reinforcement ribs 401 may have other shapes. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a package substrate having a top surface and a bottom surface;
an interposer mounted on the top surface of the package substrate;
a first semiconductor die and a second semiconductor die mounted on a top surface of the interposer in a side-by-side manner; and
a stiffener ring secured to the top surface of the package substrate, wherein the stiffener ring encircles the first semiconductor die and the second semiconductor die, and the stiffener ring comprises a reinforcement rib striding across the interposer, wherein the reinforcement rib is in direct contact with the top surface of the interposer, wherein the reinforcement rib is not coplanar with the stiffener ring, wherein the reinforcement rib is interposed between the first semiconductor die and the second semiconductor die.

2. The semiconductor package according to claim 1 further comprising a heat sink directly bonded to a rear surface of the first semiconductor die and a rear surface of the second semiconductor die.

3. The semiconductor package according to claim 2, wherein the heat sink is directly bonded to the rear surface of the first semiconductor die and the rear surface of the second semiconductor die through a thermal interface material (TIM) layer.

4. The semiconductor package according to claim 1, wherein the reinforcement rib is a strip-shaped reinforcement rib and is integrally connected to the stiffener ring through a downset portion.

5. The semiconductor package according to claim 4, wherein the downset portion integrally connects one end of the strip-shaped reinforcement rib situated on the top surface of the interposer downwardly to a sidewall of the stiffener ring situated on the top surface of the package substrate.

6. The semiconductor package according to claim 1, wherein the first semiconductor die comprises an application-specific integrated chip (ASIC) and the second semiconductor die comprises a high-bandwidth memory (HBM) chip.

7. The semiconductor package according to claim 1, wherein the reinforcement rib extends through a space between the first semiconductor die and the second semiconductor die.

8. The semiconductor package according to claim 1, wherein the reinforcement rib does not overlap with the first semiconductor die or the second semiconductor die.

9. The semiconductor package according to claim 5, wherein the reinforcement rib encircles the first semiconductor die and the second semiconductor die.

10. A semiconductor package, comprising:
a package substrate having a top surface and a bottom surface;
an interposer mounted on the top surface of the package substrate;
a first semiconductor die and a second semiconductor die mounted on the interposer in a side-by-side manner;
a molding compound encapsulating the first semiconductor die and the second semiconductor die; and
a stiffener ring secured to the top surface of the package substrate, wherein the stiffener ring comprises a reinforcement rib striding across the molding compound, wherein the reinforcement rib partially overlaps with the rear surface of the first semiconductor die.

11. The semiconductor package according to claim 10, wherein a rear surface of the first semiconductor die and a rear surface of the second semiconductor die are not covered by the molding compound.

12. The semiconductor package according to claim 11 further comprising a heat sink directly bonded to the rear surface of the first semiconductor die, the rear surface of the second semiconductor die, and a top surface of the reinforcement rib.

13. The semiconductor package according to claim 12, wherein the heat sink is directly bonded to the rear surface of the first semiconductor die, the rear surface of the second semiconductor die, and the top surface of the reinforcement rib through a thermal interface material (TIM) layer.

14. The semiconductor package according to claim 10, wherein the first semiconductor die comprises an application-specific integrated chip (ASIC) and the second semiconductor die comprises a high-bandwidth memory (HBM) chip.

15. The semiconductor package according to claim 10, wherein the reinforcement rib is integrally connected to the stiffener ring through a downset portion.

16. The semiconductor package according to claim 10, wherein the stiffener ring and the reinforcement rib are composed of copper.

17. A semiconductor package, comprising:
a package substrate having a top surface and a bottom surface;
an interposer mounted on the top surface of the package substrate;
a first semiconductor die and a second semiconductor die mounted on the interposer;
a stiffener ring secured to the top surface of the package substrate, wherein the stiffener ring encircles the first semiconductor die; and
a heat sink directly bonded to a rear surface of the first semiconductor die, wherein a reinforcement rib is interposed between the first semiconductor die and the second semiconductor die, wherein the heat sink is not in direct contact with the stiffener ring.

* * * * *